United States Patent
Cui

(10) Patent No.: US 10,270,031 B2
(45) Date of Patent: Apr. 23, 2019

(54) INKJET PRINTING FILM-FORMING METHOD, PRODUCTION METHOD OF ORGANIC LIGHT-EMITTING DEVICE, ORGANIC LIGHT-EMITTING DEVICE, AND DISPLAY APPARATUS

(71) Applicant: BOE Technology Group Co., Ltd., Beijing (CN)

(72) Inventor: Ying Cui, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/820,695

(22) Filed: Nov. 22, 2017

(65) Prior Publication Data

US 2018/0294412 A1    Oct. 11, 2018

(30) Foreign Application Priority Data

Apr. 10, 2017 (CN) .......................... 2017 1 0231008

(51) Int. Cl.
*H01L 51/00* (2006.01)
*H01L 27/32* (2006.01)
*H01L 51/56* (2006.01)
*H01L 51/50* (2006.01)

(52) U.S. Cl.
CPC ...... *H01L 51/0005* (2013.01); *H01L 27/3246* (2013.01); *H01L 27/3283* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 51/56* (2013.01)

(58) Field of Classification Search
CPC combination set(s) only.
See application file for complete search history.

(56) References Cited

U.S. PATENT DOCUMENTS

| | | | | |
|---|---|---|---|---|
| 2011/0261477 A1* | 10/2011 | Okumoto | ............ | G02B 5/201 359/886 |
| 2012/0119202 A1* | 5/2012 | Keszler | ............ | B82Y 10/00 257/43 |
| 2012/0193617 A1 | 8/2012 | Urano et al. | | |
| 2012/0273011 A1* | 11/2012 | Osada | ............ | H01L 21/67051 134/33 |

(Continued)

FOREIGN PATENT DOCUMENTS

| | | |
|---|---|---|
| CN | 102245543 A | 11/2011 |
| CN | 105679935 A | 6/2016 |
| JP | 2001-291583 A | 10/2001 |

OTHER PUBLICATIONS

First Office Action, including Search Report, for Chinese Patent Application No. 201710231008.2, dated Mar. 13, 2018, 14 pages.

*Primary Examiner* — Mamadou L Diallo
(74) *Attorney, Agent, or Firm* — Westman, Champlin & Koehler, P.A.

(57) ABSTRACT

The present disclosure provides an inkjet printing film-forming method. The method comprises following steps: forming liquid droplets of ink on a substrate by inkjet printing; and drying the liquid droplets of ink on the substrate while the substrate is spun, so that the liquid droplets of ink is allowed to form a film. The present disclosure further provides a production method of an organic light-emitting device, an organic light-emitting device, and a display apparatus.

19 Claims, 2 Drawing Sheets

(56) References Cited

U.S. PATENT DOCUMENTS

| | | | |
|---|---|---|---|
| 2013/0153873 A1* | 6/2013 | Watanabe | H01L 51/0007 257/40 |
| 2013/0167947 A1* | 7/2013 | Nakano | H01L 21/02068 137/343 |
| 2016/0020424 A1* | 1/2016 | Kim | H01L 51/5056 257/40 |
| 2016/0187729 A1* | 6/2016 | Teraoka | G02F 1/133711 349/123 |
| 2016/0359116 A1* | 12/2016 | Crowley | H01L 51/0003 |
| 2017/0267880 A1* | 9/2017 | Sonoyama | C09D 11/52 |

* cited by examiner

INKJET PRINTING FILM-FORMING METHOD, PRODUCTION METHOD OF ORGANIC LIGHT-EMITTING DEVICE, ORGANIC LIGHT-EMITTING DEVICE, AND DISPLAY APPARATUS

CROSS-REFERENCE

This application claims the priority of Chinese Patent Application No. 201710231008.2 filed on Apr. 10, 2017, which is incorporated herein in its entirety by reference.

TECHNICAL FIELD

The present disclosure relates to the inkjet printing film-forming technique, and particularly to an inkjet printing film-forming method, a production method of an organic light-emitting device, an organic light-emitting device, and a display apparatus.

BACKGROUND ART

Among various film-forming techniques, solution film-forming techniques are more and more attractive. The so-called solution film-forming is processing a desired material, for example dispersing into nanoscale minute particles, then dissolving in a corresponding solvent, next depositing this solution on the surface of a substrate by using another device, and forming a desired thin-film on the surface of the substrate after the solvent is evaporated.

Inkjet printing is relatively important one among solution film-forming techniques, and has been widely used for producing color filters, organic thin film transistors, metal electrodes, three-dimensional isolation walls, and the like in light-emitting display and for producing light-emitting devices due to the advantages of simple operation, low cost, simple process, and easiness of achieving large size. All of these have very good effects. In particular, in the processing and production of self light-emitting devices such as organic light-emitting devices (OLED) and the like, inkjet printing has attracted much attention due to multiple advantages of low cost, high efficiency, and the like.

SUMMARY OF INVENTION

In one aspect of the present disclosure, there is provided an inkjet printing film-forming method, comprising following steps:

forming liquid droplets of ink on a substrate by inkjet printing; and drying the liquid droplets of ink on the substrate under the condition that the substrate is spun, so that the liquid droplets of ink are allowed to form a film.

According to one embodiment of the present disclosure, the film-forming method further comprises a step of pre-drying the liquid droplets of ink to remove a part of solvent in the liquid droplets between the step of forming liquid droplets of ink on a substrate by inkjet printing and the step of drying the liquid droplets of ink on the substrate.

According to another embodiment of the present disclosure, the substrate is spun at a speed of 50 to 1000 revolutions/minute or 100 to 800 revolutions/minute.

According to another embodiment of the present disclosure, the step of drying the liquid droplets of ink on the substrate comprises at least one of vacuum spin drying and heat spin drying.

According to another embodiment of the present disclosure, the step of drying the liquid droplets of ink on the substrate comprises vacuum spin drying, and the vacuum degree of the vacuum spin drying is 2 to 100 Pa.

According to another embodiment of the present disclosure, the vacuum spin drying is performed for 1 to 30 minutes.

According to another embodiment of the present disclosure, the pre-drying comprises at least one of vacuum pre-drying and heat pre-drying.

According to another embodiment of the present disclosure, the pre-drying comprises vacuum pre-drying, and the vacuum degree of the vacuum pre-drying is 1000 to 20000 Pa.

According to another embodiment of the present disclosure, the vacuum pre-drying is performed for 1 to 5 minutes.

According to another embodiment of the present disclosure, the step of pre-drying the liquid droplets of ink and the step of drying the liquid droplets of ink on the substrate are performed in the same vacuum drying chamber, wherein the vacuum drying chamber has a substrate placement platform for placing the substrate, wherein the substrate placement platform has the function of spinning.

According to another embodiment of the present disclosure, the step of pre-drying the liquid droplets of ink comprises a step of heating at 25 to 50° C. for 1 to 10 minutes, and the step of drying the liquid droplets of ink on the substrate comprises a step of heating at 25 to 50° C. for 1 to 15 minutes.

According to another embodiment of the present disclosure, in the step of forming liquid droplets of ink on a substrate by inkjet printing, the size of the liquid droplet of ink formed is 1 to 30 pL.

According to another embodiment of the present disclosure, the substrate is a substrate used for color filters, organic thin film transistors, metal electrodes, or three-dimensional isolation walls in light-emitting display.

According to another embodiment of the present disclosure, the substrate is a substrate used for light-emitting devices, wherein the film formed comprises at least one of a hole injection layer, a hole transport layer, and a light-emitting layer.

According to another embodiment of the present disclosure, the step of pre-drying the liquid droplets of ink and the step of drying the liquid droplets of ink on the substrate are performed in the same vacuum drying chamber.

According to another embodiment of the present disclosure, the step of pre-drying the liquid droplets of ink and the step of drying the liquid droplets of ink on the substrate are performed in the different vacuum drying chambers.

In another aspect of the present disclosure, there is provided a production method of an organic light-emitting device, wherein the production method of an organic light-emitting device comprises: a step of forming a plurality of functional layers in a pixel region defined by a pixel defining layer by the method described above.

According to another embodiment of the present disclosure, the plurality of functional layers comprise at least two of a hole injection layer, a hole transport layer, an organic light-emitting layer, an electron transport layer, and an electron injection layer.

According to another embodiment of the present disclosure, the production method of an organic light-emitting device further comprises:

performing a step of pre-drying the liquid droplets of ink to remove a part of solvent in the liquid droplets between the step of forming liquid droplets of ink on a substrate by inkjet printing and the step of drying the liquid droplets of ink on the substrate in a process of forming each of the plurality of functional layers, so that the upper surface of the liquid droplet of ink is lower than the top of the pixel defining layer.

In another aspect of the present disclosure, there is provided an organic light-emitting device produced by the production method of an organic light-emitting device described above.

In another aspect of the present disclosure, there is provided a display apparatus comprising the organic light-emitting device described above.

DESCRIPTION OF DRAWINGS

In order to illustrate the technical solutions in examples of the present disclosure more clearly, figures required for describing the examples will be simply introduced below. It is apparent that the figures described below are merely exemplary examples of the present disclosure, and other figures may be further obtained by those of ordinary skill in the art according to these figures without exerting inventive work.

DESCRIPTION OF EMBODIMENTS

The technical solutions in the examples of the present disclosure will be described clearly and fully below in conjunction with specific embodiments of the present disclosure. Obviously, the embodiments and/or examples described are merely a part of the embodiments and/or examples of the present disclosure, rather than all of the embodiments and/or examples. Based on the embodiments and/or examples of the present disclosure, all other embodiments and/or examples obtained by those of ordinary skill in the art without performing inventive work belong to the scope protected by the present disclosure.

Embodiments of the present disclosure provide an inkjet printing film-forming method, which may allow inkjet printing to have a good film-forming state so as to improve properties of the inkjet-printed device.

Embodiments of the present disclosure provide an inkjet printing film-forming method, by which the film-forming evenness of the entire substrate may be improved and the film-forming evenness will not be caused to be inconsistent in different positions of the entire substrate since the position of the vacuum drying extraction port is fixed.

The inventor of the present disclosure has found that by adding a spinning process during drying and film-forming in inkjet printing, interface properties of inkjet printing film-forming is good and the efficiency of the light-emitting device thereof obtained by film-forming is close to that of a conventional technique such as spin coating and the like. Therefore, the inventor of the present disclosure has proposed a method for at least partially solving the problem described above, which is in particular adding a spinning step during drying and film-forming in inkjet printing to perform drying as the substrate is spun, so that the film-forming state of inkjet printing is good and therefore the efficacy of the inkjet-printed device is improved. Meanwhile, due to the addition of the spinning step, the film-forming evenness of the entire substrate is improved. Therefore, the film-forming evenness will not be caused to be inconsistent in different positions of the entire substrate since the position of the vacuum drying extraction port is fixed. This further improves the efficacy of the device.

Herein, the film and the layer may be interchangeably used, unless otherwise indicated.

Figure 1:
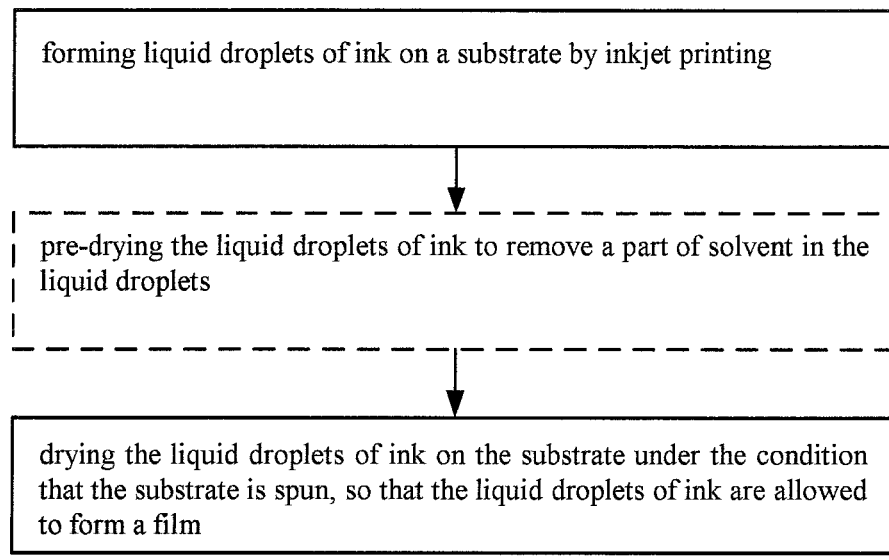
FIG. 1 is a flow chart of an inkjet printing film-forming method according to one aspect of the present disclosure.

As shown in FIG. 1, in one aspect of the present disclosure, there is provided an inkjet printing film-forming method. The method comprises following steps:

forming liquid droplets of ink on a substrate by inkjet printing; and drying the liquid droplets of ink on the substrate while the substrate is spun, so that the liquid droplets of ink are allowed to form a film.

The process described above may allow inkjet printing to have a good film-forming state so as to improve properties of the inkjet-printed device; and may improve the film-forming evenness of the entire substrate.

According to one embodiment of the present disclosure, the method may further comprise a step of pre-drying the liquid droplets of ink to remove a part of solvent in the liquid droplets between the step of forming liquid droplets of ink on a substrate by inkjet printing and the step of drying the liquid droplets of ink on the substrate.

On the substrate, there may be a pixel defining layer used for defining a pixel region. For example, the pixel defining layer may be in a trapezoidal shape. In the pixel region, liquid droplets of ink are formed on a substrate by inkjet printing. After pre-drying, the liquid droplet of ink inkjet-printed into a pixel region on a substrate is lower than the top of the pixel defining layer. Performing spin drying at this time may be advantageous to allow liquid droplets of ink to form a film in the pixel region.

According to another embodiment of the present disclosure, in the step of drying the liquid droplets of ink on the substrate, the substrate may be spun at a speed of 50 to 1000 revolutions/minute or 100 to 800 revolutions/minute. The lower limit of the spinning speed may be, for example, 60 revolutions/minute, 70 revolutions/minute, 80 revolutions/minute, revolutions/minute, 100 revolutions/minute, 150 revolutions/minute, or 200 revolutions/minute. The upper limit of the spinning speed may be, for example, 950 revolutions/minute, 900 revolutions/minute, 850 revolutions/minute, 750 revolutions/minute, 600 revolutions/minute, 500 revolutions/minute, or 400 revolutions/minute.

According to another embodiment of the present disclosure, the step of drying the liquid droplets of ink on the substrate may comprise at least one of vacuum spin drying and heat spin drying.

According to another embodiment of the present disclosure, the step of drying the liquid droplets of ink on the substrate may comprise vacuum spin drying, and the vacuum degree of the vacuum spin drying may be 2 to 100 Pa. The lower limit of the vacuum degree may be, for example, 3 Pa, 4 Pa, 5 Pa, 6 Pa, 7 Pa, 8 Pa, 9 Pa, or 10 Pa. The upper limit of the vacuum degree may be, for example, 95 Pa, 90 Pa, 80 Pa, 75 Pa, 70 Pa, 65 Pa, 60 Pa, or 55 Pa.

According to another embodiment of the present disclosure, the vacuum spin drying may be performed for 1 to 30 minutes, for example, 2 to 25 minutes or 2 to 20 minutes.

According to another embodiment of the present disclosure, the pre-drying may comprises at least one of vacuum pre-drying and heat pre-drying.

According to another embodiment of the present disclosure, the pre-drying may be vacuum pre-drying, and the vacuum degree of the vacuum pre-drying may be 1000 to 20000 Pa, the lower limit of the vacuum degree may be, for example, 1500 Pa, 2000 Pa, 2500 Pa, 3000 Pa, 3500 Pa, 4000 Pa, 4500 Pa, or 5000 Pa. The upper limit of the vacuum degree may be, for example, 18000 Pa, 16000 Pa, 14000 Pa, 12000 Pa, 10000 Pa, 9000 Pa, 8000 Pa, or 7000 Pa.

According to another embodiment of the present disclosure, the vacuum pre-drying may be performed for 1 to 5 minutes, for example, 2 to 4 minutes or about 3 minutes.

According to another embodiment of the present disclosure, the step of pre-drying the liquid droplets of ink and the step of drying the liquid droplets of ink on the substrate may be performed in the same vacuum drying chamber, wherein the vacuum drying chamber may have a substrate placement platform for placing the substrate, wherein the substrate placement platform has the function of spinning, and for example, may have the function of spinning at 0 to 25000 revolutions/minute. The vacuum drying chamber may further have a heating apparatus, so that the step of pre-drying the liquid droplets of ink and the step of drying the liquid droplets of ink on the substrate may be performed in a manner of spin vacuum drying, spin heat drying, and spin heat vacuum drying.

According to another embodiment of the present disclosure, the step of pre-drying the liquid droplets of ink comprises a step of heating at 25 to 50° C. for 1 to 10 minutes, for example, heating at 25 to 45° C. for 2 to 8 minutes; and the step of drying the liquid droplets of ink on the substrate comprises a step of heating at 25 to 50° C. for 1 to 15 minutes, for example, heating at 25 to 45° C. for 2 to 12 minutes.

According to another embodiment of the present disclosure, in the step of forming liquid droplets of ink on a substrate by inkjet printing, the size of the liquid droplet of ink formed may be 1 to 30 pL (picoliter), for example, 2 to 20 pL.

According to another embodiment of the present disclosure, the substrate may be a substrate used for color filters, organic thin film transistors, metal electrodes, or three-dimensional isolation walls in light-emitting display.

According to another embodiment of the present disclosure, the substrate is a substrate used for light-emitting devices, wherein the film formed comprises at least one of a hole injection layer, a hole transport layer, and a light-emitting layer.

According to another embodiment of the present disclosure, the step of pre-drying the liquid droplets of ink and the step of drying the liquid droplets of ink on the substrate may be performed in the same device.

In another aspect of the present disclosure, there may be further provided a method for forming a light-emitting device comprising a hole injection layer, a hole transport layer, and a light-emitting layer, wherein the method comprises: forming at least one of a hole injection layer, a hole transport layer, and a light-emitting layer by the inkjet printing film-forming method described above.

In another aspect of the present disclosure, there may be provided a light-emitting device formed by method for forming a light-emitting device comprising a hole injection layer, a hole transport layer, and a light-emitting layer described above.

In another aspect of the present disclosure, there may be provided a production method of an organic light-emitting device, wherein the production method of an organic light-emitting device comprises a step of forming a plurality of functional layers in a pixel region defined by a pixel defining layer by the film-forming method described above.

According to another embodiment of the present disclosure, the plurality of functional layers comprise at least two of a hole injection layer, a hole transport layer, an organic light-emitting layer, an electron transport layer, and an electron injection layer.

According to another embodiment of the present disclosure, the production method of an organic light-emitting device further comprises:

performing a step of pre-drying the liquid droplets of ink to remove a part of solvent in the liquid droplets between the step of forming liquid droplets of ink on a substrate by inkjet printing and the step of drying the liquid droplets of ink on the substrate in a process of forming each of the plurality of functional layers, so that the upper surface of the liquid droplet of ink is lower than the top of the pixel defining layer.

In another aspect of the present disclosure, there is provided an organic light-emitting device produced by the production method of an organic light-emitting device described above.

In another aspect of the present disclosure, there is provided an organic light-emitting device comprising the organic light-emitting device described above.

The inks used for inkjet printing the hole injection layer, the hole transport layer, and the light-emitting layer of the light-emitting device are materials which have been widely developed and used in the field of OLED printing. For example, Livilux® series inks commercially available from Merck Corporation and Lux Print® series inks commercially available from Dupont may be used, or the inks may be developed and formulated by the user himself. The inkjet printing process of this application is not limited thereto.

In another aspect of the present disclosure, there may be further provided a method for forming a light-emitting device such as an OLED and the like, and such a light-emitting device is typically a self light-emitting device. It is well known by the person skilled in the art that such a self light-emitting device comprises a light-emitting layer, and further comprises at least one layer of a hole injection layer, a hole transport layer, an electron injection layer, an electron transport layer, and the like, and this method comprises: forming at least one layer in the structure of the self light-emitting device, for example, a hole injection layer, a hole transport layer, a light-emitting layer, an electron injection layer, an electron transport layer, and the like, by the inkjet printing film-forming method described above.

According to another embodiment of the present disclosure, there may be provided a light-emitting device formed by the method for forming a light-emitting device such as an OLED and the like described above.

Figure 2:
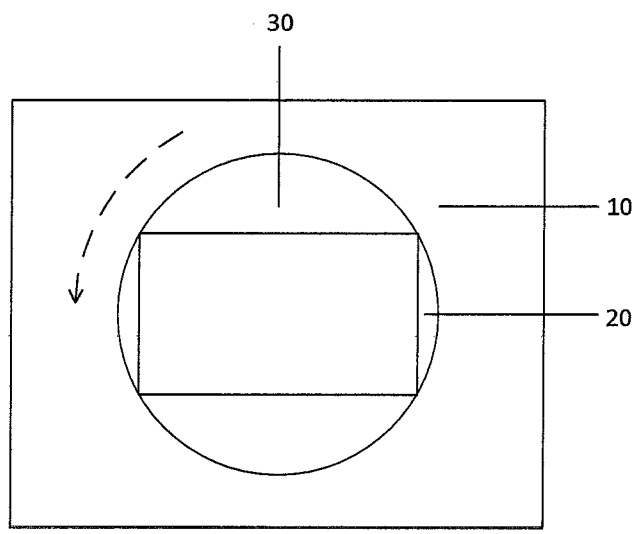
FIG. 2 is a schematic diagram of a vacuum drying chamber for implementing a method of the present disclosure according to one embodiment of the present disclosure.

FIG. 2 is a schematic diagram of a vacuum drying chamber for implementing a method of the present disclosure according to one embodiment of the present disclosure. As shown in FIG. 2, the vacuum drying chamber 10 has a substrate placement platform 20 for placing the substrate 30, wherein the substrate placement platform 20 has the function of spinning. In the vacuum drying step, the substrate 30 may be placed on the substrate placement platform 20 of the vacuum drying chamber 10 after inkjet printing, so as to vacuum-dry liquid droplets of ink in the substrate 30 while the substrate placement platform 20 is spun.

Figure 3:
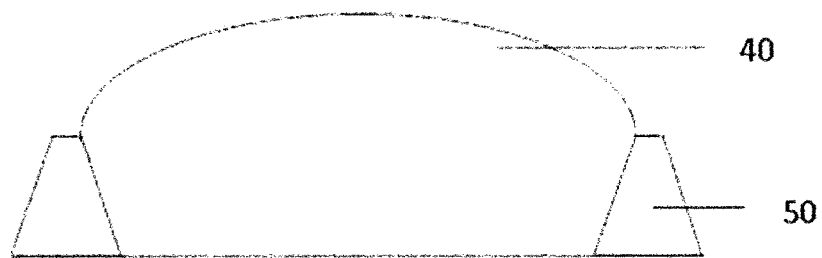
FIG. 3 is a schematic diagram of a liquid droplet of ink inkjet-printed into a pixel region on a substrate according to one embodiment of the present disclosure before pre-drying.

FIG. 3 is a schematic diagram of a liquid droplet of ink inkjet-printed into a pixel region on a substrate according to one embodiment of the present disclosure before pre-drying, and a trapezoidal pixel defining layer and a corresponding inverted trapezoidal pixel region are exemplified. As shown in FIG. 3, before pre-drying, the liquid droplet 40 of ink inkjet-printed into the pixel defining layer on the substrate exceeds the inverted trapezoidal pixel region. At this time, pre-drying is performed to remove a part of the solvent of the liquid droplet 40 of ink in the pixel region first, so that the liquid droplet 40 of ink inkjet-printed into a pixel region on a substrate is lower than the top of the trapezoidal pixel defining layer 50.

Figure 4:
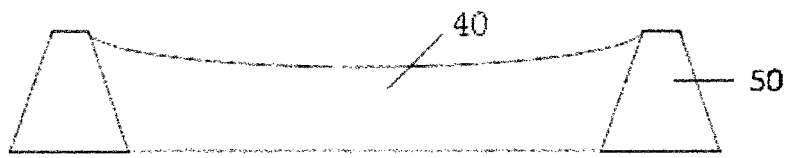
FIG. 4 is a schematic diagram of a liquid droplet of ink inkjet-printed into a pixel region on a substrate according to one embodiment of the present disclosure after pre-drying.

FIG. 4 is a schematic diagram of a liquid droplet of ink inkjet-printed into a pixel region on a substrate according to one embodiment of the present disclosure after pre-drying, and a trapezoidal pixel defining layer and a corresponding inverted trapezoidal pixel region are still exemplified. As shown in FIG. 4, after pre-drying, the liquid droplet 40 of ink inkjet-printed into a pixel region on a substrate is lower than the top of the trapezoidal pixel defining layer 50. Spin drying is performed at this time, and it may be advantageous to allow liquid droplets of ink to form a film in the inverted trapezoidal pixel region.

By the method of the present disclosure, inkjet printing may be allowed to have a good film-forming state so as to improve properties of the inkjet-printed device. The film-forming evenness of the entire substrate may be improved and the film-forming evenness will not be caused to be inconsistent in different positions of the entire substrate since the position of the vacuum drying extraction port is fixed.

EXPERIMENTAL EXAMPLES

In the following, the parts and ratios stated were by weight, unless specifically demonstrated. The examples are used for the purpose of illustration, and should not be considered to limit the scope of the present disclosure.

The examples below describe the method for producing an organic light-emitting device (OLED) to illustrate the application effect of the technical solution of the present disclosure. It is to be understood that the method may also be used to produce an organic thin film transistor, a metal electrode, or a three-dimensional isolation wall without any limitation.

Apparatuses and materials used in the examples were as follows:
  Spin vacuum apparatus: the apparatus as shown in FIG. 2
  Inkjet printing substrate, exemplified by the following specifications:
    Resolution: 80 PPI
    Size of active area (AA area): 10053.12 μm*10053.12 μm
    Pixel number of AA area: 32*32
    Size of pixel: 314.16 μm*314.16 μm
    Aperture ratio: 32.83%
  Inks: Livilux® inks purchased from Merck Corporation were exemplified.

Example 1

An indium tin oxide (ITO) transparent conductive film having thickness of 500 Å was formed on the substrate described above by vapor deposition.

By etching a pixel defining layer, a pixel region of 32*32 was formed on the substrate formed with the ITO transparent conductive film, and had a size of 314.16 μm*314.16 μm.

In the pixel region defined by the pixel defining layer, which was formed by etching, an ink used for a hole injection layer in Livilux® series ink was printed by using an inkjet printer to form liquid droplets of ink in the pixel region, so that the thickness of the film used for the hole injection layer was 550 Å after film forming. The printed substrate was placed on the substrate placement platform in the vacuum drying chamber as shown in FIG. 2, and was pre-dried under a vacuum of 6000 Pa for 3 minutes. At this time, the liquid droplet of ink in the pixel region was lower than the top of the pixel defining layer. The substrate after pre-drying was then dried under a vacuum of 50 Pa for 10 minutes to form a film while the substrate placement platform was spun at a speed of 500 revolutions/minute, so as to form the hole injection layer. In a glove box, the substrate after film forming was then placed on a hot plate and was baked at a temperature of 230° C.

On the hole injection layer, an ink used for a hole transport layer in Livilux® series ink was then printed by using an inkjet printer to form liquid droplets of ink on the hole injection layer in the pixel region, so that the thickness of the film used for the hole transport layer was 200 Å after film forming. The printed substrate was placed on the substrate placement platform in the vacuum drying chamber as shown in FIG. 2, and was pre-dried under a vacuum of 6000 Pa for 3 minutes. At this time, the liquid droplet of ink in the pixel region was lower than the top of the pixel defining layer. The substrate after pre-drying was then dried under a vacuum of 50 Pa for 10 minutes to form a film while the substrate placement platform was spun at a speed of 500 revolutions/minute, so as to form the hole transport layer. In a glove box, the substrate after film forming was then placed on a hot plate and was baked at a temperature of 180° C.

On the hole transport layer, an ink used for a light-emitting layer in Livilux® series ink was then printed by using an inkjet printer to form liquid droplets of ink on the hole transport layer in the pixel region, so that the thickness of the film used for the light-emitting layer was 700 Å after film forming. The printed substrate was placed on the substrate placement platform in the vacuum drying chamber as shown in FIG. 2, and was pre-dried under a vacuum of 6000 Pa for 3 minutes. At this time, the liquid droplet of ink in the pixel region was lower than the top of the pixel defining layer. The substrate after pre-drying was then dried under a vacuum of 50 Pa for 3 minutes to form a film while the substrate placement platform was spun at a speed of 500 revolutions/minute, so as to form the light-emitting layer. In a glove box, the substrate after film forming was then placed on a hot plate and was baked at a temperature of 150° C.

On an evaporation platform, sodium fluoride and aluminum were then evaporated to be used as electrodes respectively, wherein the thickness of sodium fluoride is 10 Å and the thickness of aluminum is 1500 Å.

Comparative Example 1

It was performed in the same manner of as that of Example 1, except that the substrate after pre-drying was subjected to a vacuum drying step in the case where the substrate placement platform was not spun in the process of forming the hole injection layer, the hole transport layer, and the light-emitting layer.

The conditions of Example 1 and Comparative Example 1 were as shown in Table 1.

TABLE 1

| | Indium tin oxide | Hole injection layer (Å) | Hole transport layer (Å) | Light-emitting layer (Å) | Sodium fluoride (Å) | Aluminum (Å) |
|---|---|---|---|---|---|---|
| Comparative Example 1 | 500 | 550 | 200 | 700 | 10 | 1500 |
| Example 1 | 500 | 550 | 200 | 700 | 10 | 1500 |

Properties of devices obtained in Example 1 and Comparative Example 1 were measured by using a current-voltage-luminance (IVL) measurement system. Measurement results were as shown in Table 2.

TABLE 2

| | Efficiency (cd/A) @1 kcd/m$^2$ | External quantum efficiency (%) @1 kcd/m$^2$ | Voltage (V) @1 kcd/m$^2$ | Voltage (V) @10 mA/cm$^2$ | CIEx @1 kcd/m$^2$ | CIEy @1 kcd/m$^2$ |
|---|---|---|---|---|---|---|
| Comparative Example 1 | 26.8 | 7.2 | 5.4 | 6.4 | 0.303 | 0.643 |
| Example 1 | 38.7 | 10.4 | 5.0 | 6.0 | 0.295 | 0.648 |

It can be seen from data of Table 2 that the efficacy of the device obtained in Example 1 is higher than that of Comparative Example 1 by about 44%, with respect to both of the efficiency (cd/A) @1 kcd/m$^2$ and the external quantum efficiency (%) @1 kcd/m$^2$. As thus demonstrated, a spinning step is added during drying and film-forming in inkjet printing to perform vacuum drying as the substrate is spun, so that the film-forming state of inkjet printing is closer to the film-forming state of spin coating and the efficacy of the inkjet-printed device can be improved.

Although good properties of the process disclosed in this invention have been illustrated by exemplifying a structure of an OLED light-emitting device in examples described above, the applicant has found in the practice of the process that technical solutions suitable for the present disclosure also have good film-forming properties with respect to other devices which may be subjected to inkjet film-forming.

Obviously, various modifications and variations may be made to the examples of the present disclosure by the person skilled in the art without deviating from the spirit and the scope of the present disclosure. Thus, if these modifications and variations of the present disclosure are within the scope of the claims of the present disclosure and equivalent techniques thereof, the present disclosure also intends to encompass these modifications and variations.

What is claimed is:

1. An inkjet printing film-forming method, comprising following steps:
    forming liquid droplets of ink on a substrate by inkjet printing; and
    drying the liquid droplets of ink on the substrate in vacuum under the condition that the substrate is spun, so that the liquid droplets of ink are allowed to form a film.

2. The film-forming method according to claim 1, further comprising a step of pre-drying the liquid droplets of ink to remove a part of solvent in the liquid droplets between the step of forming liquid droplets of ink on a substrate by inkjet printing and the step of drying the liquid droplets of ink on the substrate.

3. The film-forming method according to claim 1, wherein in the step of drying the liquid droplets of ink on the substrate, the substrate is spun at a speed of 50 to 1000 revolutions/minute.

4. The film-forming method according to claim 1, wherein in the step of drying the liquid droplets of ink on the substrate, the substrate is spun at a speed of 100 to 800 revolutions/minute.

5. The film-forming method according to claim 1, wherein the step of drying has a vacuum degree of 2 to 100 Pa.

6. The film-forming method according to claim 1, wherein the step of drying is performed for 1 to 30 minutes.

7. The film-forming method according to claim 2, wherein the pre-drying comprises at least one of vacuum pre-drying and heat pre-drying.

8. The film-forming method according to claim 7, wherein the pre-drying is vacuum pre-drying, and the vacuum degree of the vacuum pre-drying is 1000 to 20000 Pa.

9. The film-forming method according to claim 7, wherein the vacuum pre-drying is performed for 1 to 5 minutes.

10. The film-forming method according to claim 2, wherein the step of pre-drying the liquid droplets of ink and the step of drying the liquid droplets of ink on the substrate are performed in the same vacuum drying chamber, wherein the vacuum drying chamber has a substrate placement platform for placing the substrate, wherein the substrate placement platform has the function of spinning.

11. The film-forming method according to claim 2, wherein the step of pre-drying the liquid droplets of ink comprises a step of heating at 25 to 50° C. for 1 to 10 minutes, and the step of drying the liquid droplets of ink on the substrate comprises a step of heating at 25 to 50° C. for 1 to 15 minutes.

12. The film-forming method according to claim 1, wherein in the step of forming liquid droplets of ink on a substrate by inkjet printing, the size of the liquid droplet of ink formed is 1 to 30 pL.

13. The film-forming method according to claim 1, wherein the substrate is a substrate used for color filters, organic thin film transistors, metal electrodes, or three-dimensional isolation walls in light-emitting display.

14. The film-forming method according to claim 1, wherein the substrate is a substrate used for light-emitting devices, wherein the film formed comprises at least one of a hole injection layer, a hole transport layer, and a light-emitting layer.

15. A production method of an organic light-emitting device, wherein the production method of an organic light-emitting device comprises a step of forming a plurality of functional layers in a pixel region defined by a pixel defining layer by the film-forming method of claim 1.

16. The production method of an organic light-emitting device according to claim 15, wherein the plurality of functional layers comprise at least two of a hole injection layer, a hole transport layer, an organic light-emitting layer, an electron transport layer, and an electron injection layer.

17. The production method of an organic light-emitting device according to claim 15, further comprising:
    performing a step of pre-drying the liquid droplets of ink to remove a part of solvent in the liquid droplets between the step of forming liquid droplets of ink on a substrate by inkjet printing and the step of drying the liquid droplets of ink on the substrate in a process of forming each of the plurality of functional layers, so that the upper surface of the liquid droplet of ink is lower than the top of the pixel defining layer.

18. An organic light-emitting device produced by the production method of an organic light-emitting device according to claim 15.

19. A display apparatus comprising the organic light-emitting device according to claim 18.

* * * * *